(12) United States Patent
Ritzdorf et al.

(10) Patent No.: US 6,753,251 B2
(45) Date of Patent: Jun. 22, 2004

(54) METHOD FOR FILLING RECESSED MICRO-STRUCTURES WITH METALLIZATION IN THE PRODUCTION OF A MICROELECTRONIC DEVICE

(75) Inventors: Thomas L. Ritzdorf, Bigfork, MT (US); Lyndon W. Graham, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/112,166

(22) Filed: Mar. 28, 2002

(65) Prior Publication Data

US 2002/0102837 A1 Aug. 1, 2002

Related U.S. Application Data

(63) Continuation of application No. 09/018,783, filed on Feb. 4, 1998.

(51) Int. Cl.[7] .......................................... H01L 21/4763
(52) U.S. Cl. ...................... 438/638; 438/674; 205/157; 205/159
(58) Field of Search ................. 205/105, 157, 205/159; 438/633, 638, 674

(56) References Cited

U.S. PATENT DOCUMENTS

| | | |
|---|---|---|
| 2,443,599 A | 6/1948 | Chester |
| 3,658,663 A | 4/1972 | Fukanuma et al. |
| 3,716,462 A | 2/1973 | Jensen |
| 3,862,891 A | 1/1975 | Smith |
| 3,878,066 A | 4/1975 | Dettke et al. |
| 3,894,918 A | 7/1975 | Corby et al. |
| 3,990,926 A | 11/1976 | Konicek |
| 4,030,015 A | 6/1977 | Herko et al. |
| 4,043,877 A | 8/1977 | Littwin |
| 4,065,374 A | 12/1977 | Asami et al. |
| 4,100,054 A | 7/1978 | DuRocher |
| 4,113,391 A | 9/1978 | Minowa |
| 4,250,004 A | 2/1981 | Miles et al. |
| 4,253,919 A * | 3/1981 | Hall et al. ................... 205/224 |
| 4,385,978 A | 5/1983 | Prusak |
| 4,401,521 A | 8/1983 | Ohmura et al. |
| 4,443,117 A | 4/1984 | Muramoto et al. |

(List continued on next page.)

FOREIGN PATENT DOCUMENTS

| | | |
|---|---|---|
| EP | 0 751 567 A2 | 1/1997 |
| EP | 0 881 673 A2 | 12/1998 |
| EP | 0964433 A2 | 12/1999 |
| EP | 0 982 771 A1 | 3/2000 |

(List continued on next page.)

OTHER PUBLICATIONS

U.S. patent application Ser. No. 09/018,783, Ritzdorf et al., filed Feb. 4, 1998.
Lowenheim, Frederick A., "Electroplating", (1979), pp 12, 13, 416–423, McGraw–Hill Book Company, New York.

(List continued on next page.)

Primary Examiner—George Fourson
Assistant Examiner—Fernando L. Toledo
(74) Attorney, Agent, or Firm—Perkins Coie LLP (57) ABSTRACT

A method for filling recessed micro-structures at a surface of a semiconductor wafer with metallization is set forth. In accordance with the method, a metal layer is deposited into the micro-structures with a process, such as an electroplating process, that generates metal grains that are sufficiently small so as to substantially fill the recessed micro-structures. The deposited metal is subsequently subjected to an annealing process at a temperature below about 100 degrees Celsius, and may even take place at ambient room temperature to allow grain growth which provides optimal electrical properties.

43 Claims, 5 Drawing Sheets

U.S. PATENT DOCUMENTS

| | | |
|---|---|---|
| 4,475,823 A | 10/1984 | Stone |
| 4,539,222 A | 9/1985 | Anderson, Jr. et al. |
| 4,576,689 A | 3/1986 | Makkaev et al. |
| 4,687,552 A | 8/1987 | Early et al. |
| 4,781,801 A | 11/1988 | Frisby |
| 4,810,333 A | 3/1989 | Gulla et al. |
| 4,869,971 A | 9/1989 | Nee et al. |
| 4,879,007 A | 11/1989 | Wong |
| 4,891,069 A | 1/1990 | Holtzman et al. |
| 4,898,647 A | 2/1990 | Luce et al. |
| 4,951,601 A | 8/1990 | Maydan et al. |
| 4,959,278 A | 9/1990 | Shimauchi et al. |
| 4,979,464 A | 12/1990 | Kunze-Concewitz et al. |
| 5,000,827 A | 3/1991 | Schuster et al. |
| 5,084,412 A | 1/1992 | Nakasaki |
| 5,091,339 A | 2/1992 | Carey |
| 5,115,430 A | 5/1992 | Hahne et al. |
| 5,135,636 A | 8/1992 | Yee et al. |
| 5,145,571 A | 9/1992 | Lane et al. |
| 5,151,168 A | 9/1992 | Gilton et al. |
| 5,155,336 A | 10/1992 | Gronet et al. |
| 5,160,600 A | 11/1992 | Patel et al. |
| 5,164,332 A | 11/1992 | Kumar |
| 5,207,883 A | 5/1993 | Borrione et al. |
| 5,209,817 A | 5/1993 | Ahmad et al. |
| 5,252,807 A | 10/1993 | Chizinsky |
| 5,256,274 A | 10/1993 | Poris |
| 5,277,985 A | 1/1994 | Li et al. |
| 5,306,895 A | 4/1994 | Ushikoshi et al. |
| 5,314,756 A | 5/1994 | Tagaya |
| 5,372,848 A | 12/1994 | Blackwell et al. |
| 5,391,517 A | 2/1995 | Gelatos et al. |
| 5,397,741 A | 3/1995 | O'Connor et al. |
| 5,403,468 A | 4/1995 | Nakakoji et al. |
| 5,411,076 A | 5/1995 | Matsunaga et al. |
| 5,431,803 A | 7/1995 | DiFranco et al. |
| 5,441,618 A * | 8/1995 | Matsuda et al. ............ 204/203 |
| 5,447,599 A | 9/1995 | Li et al. |
| 5,472,502 A | 12/1995 | Batchelder |
| 5,484,518 A | 1/1996 | Goldberg |
| 5,516,416 A | 5/1996 | Canaperi et al. |
| 5,549,808 A | 8/1996 | Farooq et al. |
| 5,567,267 A | 10/1996 | Kazama et al. |
| 5,584,971 A | 12/1996 | Komino |
| 5,600,532 A | 2/1997 | Michiya et al. |
| 5,605,615 A * | 2/1997 | Goolsby et al. ............ 205/83 |
| 5,612,254 A | 3/1997 | Mu et al. |
| 5,627,102 A | 5/1997 | Shinriki et al. |
| 5,639,316 A | 6/1997 | Cabral, Jr. et al. |
| 5,650,082 A | 7/1997 | Anderson |
| 5,651,823 A | 7/1997 | Parodi et al. |
| 5,660,472 A | 8/1997 | Peuse et al. |
| 5,674,787 A | 10/1997 | Zhao et al. |
| 5,677,244 A | 10/1997 | Venkatraman |
| 5,681,443 A | 10/1997 | Ameen et al. |
| 5,685,970 A | 11/1997 | Ameen et al. |
| 5,693,563 A | 12/1997 | Teong |
| 5,707,466 A | 1/1998 | Atwater et al. |
| 5,747,355 A | 5/1998 | Konuma et al. |
| 5,763,953 A | 6/1998 | Iljima et al. |
| 5,779,799 A | 7/1998 | Davis |
| 5,801,444 A | 9/1998 | Aboelfotoh et al. |
| 5,802,856 A | 9/1998 | Schaper et al. |
| 5,814,557 A | 9/1998 | Venkatraman et al. |
| 5,873,992 A | 2/1999 | Glezen et al. |
| 5,882,498 A | 3/1999 | Dubin et al. |
| 5,892,207 A | 4/1999 | Kawamura et al. |
| 5,893,752 A | 4/1999 | Zhang et al. |
| 5,932,077 A | 8/1999 | Reynolds |
| 5,937,142 A | 8/1999 | Moslehi et al. |
| 5,939,788 A | 8/1999 | McTeer |
| 5,958,207 A * | 9/1999 | Mull ......................... 205/104 |
| 5,969,422 A | 10/1999 | Ting et al. |
| 5,972,192 A * | 10/1999 | Dubin et al. ................ 205/101 |
| 5,989,623 A | 11/1999 | Chen et al. |
| 6,001,730 A | 12/1999 | Farkas et al. |
| 6,015,749 A | 1/2000 | Lui et al. |
| 6,017,820 A | 1/2000 | Ting et al. |
| 6,037,257 A | 3/2000 | Chiang et al. |
| 6,043,153 A | 3/2000 | Nogami et al. |
| 6,066,892 A | 5/2000 | Ding et al. |
| 6,072,160 A | 6/2000 | Bahl |
| 6,072,163 A | 6/2000 | Armstrong et al. |
| 6,073,681 A | 6/2000 | Getchel et al. |
| 6,074,544 A * | 6/2000 | Reid et al. .................. 205/157 |
| 6,086,680 A | 7/2000 | Foster et al. |
| 6,099,712 A | 8/2000 | Ritzdorf et al. |
| 6,100,195 A | 8/2000 | Chan et al. |
| 6,107,192 A | 8/2000 | Subrahmanyan et al. |
| 6,108,937 A | 8/2000 | Raaijmakers |
| 6,121,141 A | 9/2000 | Woo et al. |
| 6,123,825 A | 9/2000 | Uzoh et al. |
| 6,126,761 A | 10/2000 | DeHaven et al. |
| 6,126,989 A | 10/2000 | Robinson et al. |
| 6,130,415 A | 10/2000 | Knoot |
| 6,136,163 A * | 10/2000 | Cheung et al. ............. 204/198 |
| 6,139,697 A | 10/2000 | Chen et al. |
| 6,139,703 A | 10/2000 | Hanson et al. |
| 6,157,106 A | 12/2000 | Tietz et al. |
| 6,184,068 B1 | 2/2001 | Ohtani et al. |
| 6,184,121 B1 | 2/2001 | Buchwalter et al. |
| 6,184,137 B1 | 2/2001 | Ding et al. |
| 6,228,768 B1 | 5/2001 | Woo et al. |
| 6,254,758 B1 | 7/2001 | Koyama |
| 6,278,089 B1 | 8/2001 | Young et al. |
| 6,280,183 B1 | 8/2001 | Mayur et al. |
| 6,297,154 B1 | 10/2001 | Gross et al. |
| 6,471,913 B1 | 10/2002 | Weaver et al. |
| 6,638,849 B2 * | 10/2003 | Ting et al. .................. 483/618 |
| 2002/0096508 A1 | 7/2002 | Weaver et al. |
| 2003/0045095 A1 | 3/2003 | Ritzdorf et al. |
| 2003/0057099 A1 * | 3/2003 | Guldi et al. ................ 205/291 |
| 2003/0057614 A1 | 3/2003 | Weaver et al. |
| 2003/0146102 A1 * | 8/2003 | Ramanathan et al. ....... 205/291 |

FOREIGN PATENT DOCUMENTS

| | | |
|---|---|---|
| EP | 1069213 A2 | 7/2000 |
| EP | 01910554.3 | 2/2001 |
| JP | 57073953 | 10/1982 |
| JP | 10-083960 | 3/1998 |
| JP | 2001-559043 | 2/2001 |
| TW | 161336 | 12/2002 |
| WO | WO 91/04213 | 4/1991 |
| WO | WO 98/27585 | 6/1998 |
| WO | WO 99/40615 | 8/1999 |
| WO | WO 99/45745 | 9/1999 |
| WO | WO 00/61837 | 4/2000 |
| WO | WO 01/59815 | 2/2001 |

OTHER PUBLICATIONS

Ahn, E. C. et al. "Adhesion Reliability of Cu–Cr Alloy Films to Polyimide" *Materials Research Society Symposium Proceedings,* 1996, vol. 427, pp. 141–146, Materials Research Society.

Alers, G. B. et al. "Trade–off between reliability and post–CMP defects during recrystallization anneal for copper damascene interconnects" *IEEE International Reliability Physics Symposium,* 2001, pp. 350–354.

Gladkikh, A. et al. "Activation Energy of Electromigration in Copper Thin Film Conductor Lines" *Materials Research Society Symposium Proceedings,* 1996, vol. 427, pp. 121–126, Materials Research Society.

Kononenko, O. V. et al. "Electromigration In Submicron Wide Copper Lines" *Materials Research Society Symposium Proceedings,* 1996, vol. 427, pp. 127–132, Materials Research Society.

Kuppurao, Satheesh et al., "Rapid Thermal Oxidation Technique," Solid State Technology, Jul. 2000, pp 223–224, 236, 239.

Megaw, H.D. and Stokes, A.R., "Breadths of X–Ray Diffraction Lines and Mechanincal Properties of Some Cold–Worked Metals," *J Inst. Metals,* vol. LXXI, pp. 279–289 (1944).

Mei, Y. et al. "Thermal Stability and Interaction Between SIOF and Cu Film" *Materials Research Society Symposium Proceedings,* 1996, vol. 427, pp. 433–439, Materials Research Society.

Osborne, Nick et al., "Hot–Wall Furnace RTP," Solid State Technology, Jul. 2000, pp 211–212, 214, 216, 217.

Peuse, Bruce et al., "Advances in RTP Temperature Measurement and Control," Materials Research Society Symposium, Spring 1998, pp 1–15.

Russell, S. W. et al. "The Effect of Copper on the Titanium–Silicon Dioxide Reaction and the Implications for Self–Encapsulating, Self–Adhering Metallization Lines", *Materials Research Society Symposium Proceedings,* 1992, vol. 260, pp. 763–768, Materials Research Society, Pittsburgh, PA.

Thakur, R.P.S. et al., "RTP technology for tomorrow," Jun. 1, 1998, http://www.semipark.co.kr./ifil/%EA%b8% . . . /RTP%20technology%20for%20tomorrow.ht, accessed Feb. 28, 2001.

Yoo, Woo Sik et al., "Rapid Thermal Furnance," Solid State Technology, Jul. 2000, pp 223–4, 226, 228, 230.

International Search Report for International Application No. PCT/US01/04444; mailed Dec. 5, 2001, Applicant: Semitool, 7 pgs.

Nguyen et al, "Interconnect and Contact Metallization", Eds. H.S. Rathore, G.S. Mathan, C. Plougonver and C.C. Schuckert, PV 97–31, The Electrochemical Society, Inc., Pennington, NJ.

Foulke, D.G., in *"Gold Plating Technology"*, Reid, F.H. and Goldie, W., p. 67, Electrochemical Publication Limited. British Isles (1996).

Tomov, V., Stoychev, D.S., Vitanova, I.B., "Recovery And Recrystallization Of Electrodeposited Bright Copper Coatings At Room Temperature. II. X–Ray Investigation Of Primary Recrystallization", *Journal of Applied Electrochemistry,* 15, 887–894. Chapman and Hall Ltd. (1985).

Stoychev, D.S., Tomov, V., Vitanova, I.B., "Recovery And Recrystallization Of Electrodeposited Bright Copper Coatings At Room Temperature. I Microhardness in relation to Coating Structure",*Journal of Applied Electrochemistry,* 15, 879–886. Chapman and Hall Ltd. (1985).

Ritzdorf, T., Graham, L., Jin, S., Mu, C. and Fraser, D., "Self–Annealing of Electrochemically Deposited Copper Films in Advanced Interconnect Applications," Proceedings of the IEEE 1998 International Interconnect Technology Conference, San Francisco, CA (Jun. 1–3, 1998).

Dubin, V.M., Shacham–Diamand, Y., Zhao, B., Vasudev, P.K. and Ting, C.H., "Sub–Half Micron Electroless Cu Metallization," Materials Research Society Symposium Proceedings, vol. 427, San Francisco, (1996).

Cook, M. and Richards, T., "The Self–Annealing of Copper," *J. Inst. Metals,* vol. LXX, pp. 159–173 (1943).

Mak, C.Y., "Electroless Copper Deposition on Metals and Metal Silicides," Materials Research Society Bulletin, (Aug. 1994).

Hogan, B.M., "Microstructural Stability of Copper Electroplate," (citation unknown but believed to be published more than one year before the date of this patent application).

Stoychev, D. Vitanova, I. Vieweger, U., "Influence of the Inclusions in Thick Copper Coatings on Their Physico—Mechanical Properties," (citation unknown but believed to be published more than one year before the date of this patent application).

Stoychev, D.S., and Aroyo, M.S., "The Influence of Pulse Frequency on the Hardness of Bright Copper Electrodeposits," *Plating & Surface Finishing,* pp. 26–28 (Aug. 1997).

Stoychev, D.S., and Aroyo, M.S., On the Influence of Pulse Frequency on the Hardness of Bright Copper Electrodeposits, (citation unknown but believed to be published more than one year before the date of this patent application).

Stein, B., "A Practical Guide to Understanding, Measuring and Controlling Stress in Electroformed Metals," presented at the AESF Electroforming Symposium, Las Vegas, NV (Mar. 1996).

Sanchez, J. Jr., Besser, P.R., and Field, D.P., "Microstructure of Damascene Processed Al–Cu Interconnects for Integrated Circuit Applications," presented at the Fourth International Workshop on Stress Induced Phenomena in Metallizations, Tokyo, Japan (Jun. 1997).

Sanchez, J. Jr. and Besser, P.R., "Modelling Microstructure Development in Trench–Interconnect Structures," Proceedings of the IEEE 1998 International Interconnect Technology Conference, Sunnyvale, CA (Jun. 1998).

Field, D.P., Sanchez, J. Jr., Besser, P.R., Dingley, D.J., "Analysis of Grain–Boundary Structure in Al–Cu Interconnects," *J. Appl. Phys.,* 82(5) (Sep. 1, 1997).

Gupta, D., "Comparative Cu Diffusion Studies in Advanced Metallizations of Cu and Al–Cu Based Thin Films," Materials Research Society Symposium Proceedings, San Francisco, CA (Apr. 1994).

Megaw, H.D. and Stokes, A.R., "Breadths of X–Ray Diffraction Lines and Mechanical Properties of Some Cold–Worked Metals," *J. Inst. Metals,* vol. LXXI, pp. 279–289 (1944).

Thompson, C.V., and Knowlton, B.D., "Designing Circuits and Processes to Optimize Performance and Reliability: Metallurgy Meets Tcad," *Microelectronics and Reliability,* 36, P. 1683 (1996).

Carel, R., Thompson, C.V., Frost, H.J., *Material Research Society Symposium,* vol. 343, Materials Research Society (1994).

Floro, J.A., Carel, R. and Thompson, C.V., "Energy Minimization During Epitaxial Grain Growth Strain vs. Interfacial Energy," *Material Research Society Symposium,* vol. 317, Materials Research Society (1994).

Plötner, M., Urbansky, N., Preusz, A. and Wenzel, C., "Control of Mechanical Stresses and their Temperature Dependence in PVD CU Films," presented at Adv. Metalliz. & Interconn. Syst. ULSI Applic. San Diego (1997).

Wong, Chee. C., Smith, H.I., and Thompson, C.V., "Secondary Grain Growth and Graphoepitaxy in Thin Au Films on Submicrometer–Period Gratings," *Material Research Society Symposium Proc,* vol. 47 Materials Research Society (1985).

Thompson, C.V., and Smith, H.I., "Secondary Grain Growth in Thin Films." *Material Research Society Symposium Proc.,* vol. 57, Materials Research Society (1987).

Wong, C.C., Smith, H.I., and Thompson, C.V., Room Temperature Grain Growth in Thin Au Films from *Grain Boundary Structure and Related Phenomena,* supplement to *Transactions of Japanese Institute of Metals,* 27, p. 641 (1986).

Thompson, C.V., "Observations of Grain Growth in Thin Films," from *Microstructural Science for Thin Film Metalizations in Electronics Applications,* eds. J. Sanchez, D.A. Smith and N. DeLanerolle, The Minerals, Metals & Materials Society (1988).

Frost, H.J., Thompson, C.V., and Walton, D.T., "Abnormal Grain Growth in Thin Films Due to Anisotropy of Free–Surface Energies," *Materials Science Forum,* vols. 94–96, pp. 543–550, Trans Tech Publications, Switzerland (1992).

Frost, H.J. and Thompson, C.V., "Microstructural Evolution in Thin Films," presented at the Symposium on Computer Simulation of Microstructural Evolution, Toronto, Canada, Oct. 15 (1985).

Frost, H.J. Thompson, C.V., and Walton, D.T., "Grain Growth Stagnation and Abnormal Grain Growth in Thin Films," presented at TMS–AIME Fall Meeting, Indianapolis, IN (1989).

Reed–Hall, et al., "Physical Metallurgy Principles," pp. 270, 286 and 287, $83^{rd}$ Ed. (1991).

Frost, H.J. and Thompson, C.V., "Modeling of Optical Thin Films," reprint from Proceedings of SPIE (International Society for Optical Engineering, San Diego, CA 1987, printed by the Society of Photo–Optical Instrumentation Engineers (1988).

Walton, D.T., Frost, H.J. and Thompson, C.V., "Computer Simulation of Grain Growth in Thin–Film Interconnect Lines," Mat. Res. Soc. Symp. Proc., vol. 225 (1991).

Harper, J.M.E., Rodbell, K.P., "Microstructure control in semiconductor metallization", *J. Vac. Sci. Technol.* B 15(4), pp. 763–779, Jul./Aug. 1997.

Gangulee, A., "The Structure of Electroplated and Vapor–Deposited Copper Films", *J. Appl. Phys.,* vol. 43, No. 3, pp. 867–873, Mar. 1972.

Gangulee, A., "Structure of Electroplated and Vapor–Deposited Copper Films III. Recrystallization and Grain Growth", *J. Appl. Phys.,* vol. 45, No. 9, pp. 3749–3756, Sep. 1974.

Gross, M.E. et al, "Microstructure and Texture of Electroplated Copper in Damascene Structures", *Material Research Society Proceedings,* vol. 514, 1998.

Edelstein, D. et al, "Full Copper Wiring in a Sub–0.25$\mu$m CMOS ULSI Technology", IEEE, pp. 773–776, 1997.

Ryan, J.G. et al, "Technology Challenges for Advanced Interconnects".

Lowenheim, Frederick, "Electroplating", pp. 416–425, Jan. 1979.

Patent Abstracts of Japan 04–120290, Apr. 21, 1992.

\* cited by examiner

METHOD FOR FILLING RECESSED MICRO-STRUCTURES WITH METALLIZATION IN THE PRODUCTION OF A MICROELECTRONIC DEVICE

CROSS-REFERENCE TO RELATED APPLICATIONS

This application is a continuation of U.S. patent application Ser. No. 09/018,783, filed Feb. 4, 1998.

STATEMENT REGARDING FEDERALLY SPONSORED RESEARCH OR DEVELOPMENT

Not Applicable

BACKGROUND OF THE INVENTION

In the production of semiconductor integrated circuits and other microelectronic articles from semiconductor wafers, it is often necessary to provide multiple metal layers on a substrate to serve as interconnect metallization which electrically connects the various devices on the integrated circuit to one another. Traditionally, aluminum has been used for such interconnects, however, it is now recognized that copper metallization may be preferable.

Modem semiconductor manufacturing processes, especially those used for advanced logic devices, make use of multiple layers of metal interconnects. As the length of metal interconnects increases and the cross-sectional area and spacing between them decreases, the RC delay caused by the interconnect wiring also increases. With the drive toward decreasing interconnect size and the increasing demands placed on the interconnects, the current aluminum interconnect technology becomes deficient. Copper interconnects can help alleviate many of the problems experienced in connection with the current aluminum technology.

In view of die limitations of aluminum interconnect technology, the industry has sought to use copper as the interconnect metallization by using a damascene and/or patterned plating electroplating process where holes, more commonly called vias, trenches and other recesses are used to produce the desired copper patterns. In the damascene process, the wafer is first provided with a metallic seed layer and barrier/adhesion layer which are disposed over a dielectric layer into which trenches are formed. The seed layer is used to conduct electrical current during a subsequent metal electroplating step. Preferably, the seed layer is a very thin layer of metal which can be applied using one of several processes. For example, the seed layer of metal can be laid down using physical vapor deposition or chemical vapor deposition processes to produce a layer on the order of 1000 angstroms thick. The seed layer can also be formed of copper, gold, nickel, palladium, and most or all other metals. The seed layer is formed over a surface which is convoluted by the presence of the trenches, or other device features, which are recessed into the dielectric substrate.

In single damascene processes using electroplating, a process employing two electroplating operations is generally employed. First, a copper layer is electroplated onto the seed layer in the form of a blanket layer. The blanket layer is plated to an extent which forms an overlying layer, with the goal of completely providing a copper layer that fills the trenches that are used to form the horizontal interconnect wiring in the dielectric substrate. The first blanket layer is then subject, for example, to a chemical mechanical polish step in which the portions of the layer extending above the trenches are removed, leaving only the trenches filled with copper. A further dielectric layer is then provided to cover the wafer surface and recessed vias are formed in the further dielectric layer. The recessed vias are disposed to overlie certain of the filled trenches. A further seed layer is applied and a further electroplated copper blanket layer is provided that extends over the surface of the further dielectric layer and fills the vias. Again, copper extending above the level of the vias is removed using, for example, chemical mechanical polishing techniques. The vias thus provide a vertical connection between the original horizontal interconnect layer and a subsequently applied horizontal interconnect layer. Electrochemical deposition of copper films has thus become an important process step in the manufacturing of high-performance microelectronic products.

Alternatively, the trenches and vias may be etched in the dielectric at the same time in what is commonly called a "dual damascene" process. These features are then processed, as above, with barrier layer, seed layer and fill/blanket layer which fills the trenches and vias disposed at the bottoms of the trenches at the same time. The excess material is then polished, as above, to produce inlaid conductors.

The electrical properties of the copper metallization are important to the performance of the associated microelectronic device. Such devices may fail if the copper metallization exhibits excessive electromigration that ultimately results in an open circuit condition in one or more of the metallization structures. One factor that has a very large influence on the electromigration resistance of sub-micron metal lines is the grain size of the deposited metal. This is because grain boundary migration occurs with a much lower activation energy than trans-granular migration.

To achieve the desired electrical characteristics for the copper metallization, the grain structure of each deposited blanket layer is altered through an annealing process. This annealing process is traditionally thought to require the performance of a separate processing step at which the semiconductor wafer is subject to an elevated temperature of about 400 degrees Celsius.

The present inventors have recognized substantial improvements over the foregoing processes employing the elevated temperature annealing. To this end, the present inventors have disclosed herein a process for filling vias, trenches, and the like using an electrochemical metal deposition process that does not require a subsequent elevated temperature annealing step or, in the alternative, that uses a subsequent elevated temperature annealing process that takes place at temperatures that are traditionally used in the copper metallization process and are compatible with low temperature semiconductor processing.

BRIEF SUMMARY OF THE INVENTION

A method for filling recessed micro-structures at a surface of a semiconductor wafer with metallization is set forth. In accordance with the method, a layer is deposited into the micro-structures with a process, such as an electroplating process, that generates grains that are sufficiently small so as to substantially fill the recessed micro-structures. The deposited metal is subsequently subjected to an annealing process at a temperature below about 100 degrees Celsius, and may even take place at ambient room temperature.

One embodiment of the method comprises providing a semiconductor wafer with a feature that is to be connected with copper metallization. At least one dielectric layer is applied over a surface of the semiconductor wafer including the feature. Recessed micro-structures are then provided in the at least one dielectric layer. A surface of the wafer, including the recessed micro-structures, is provided with barrier/adhesion layer and a seed layer for subsequent electrochemical copper deposition. Copper metallization is electrochemically deposited on the surface of the wafer to substantially fill the recessed micro-structures. The present inventors have found that such an electrochemically deposited layer may be annealed at temperatures that are substantially lower than the temperatures typically thought necessary for such annealing. Various methods are set forth that take advantage of this finding.

In a further embodiment of the disclosed method, the electrochemically deposited copper layer is allowed to self-anneal at ambient room temperature for a predetermined period of time before removing copper metallization from the surface of the wafer that extends beyond the recessed features.

In accordance with a still further embodiment of the disclosed method, subsequent wafer processing, including removal of selected areas of the copper metallization, takes place without an intermediate elevated temperature annealing step and may, for example, take place fore self-annealing is allowed to occur.

In accordance with a still further embodiment of the method, the electrochemically deposited copper is subject to an elevated temperature annealing process. However, that annealing process takes place at a temperature below about 100 degrees Celsius or at a temperature below which an applied low-K dielectric layer suffers degradation in its mechanical and electrical properties.

DETAILED DESCRIPTION OF THE INVENTION

Figure 1:
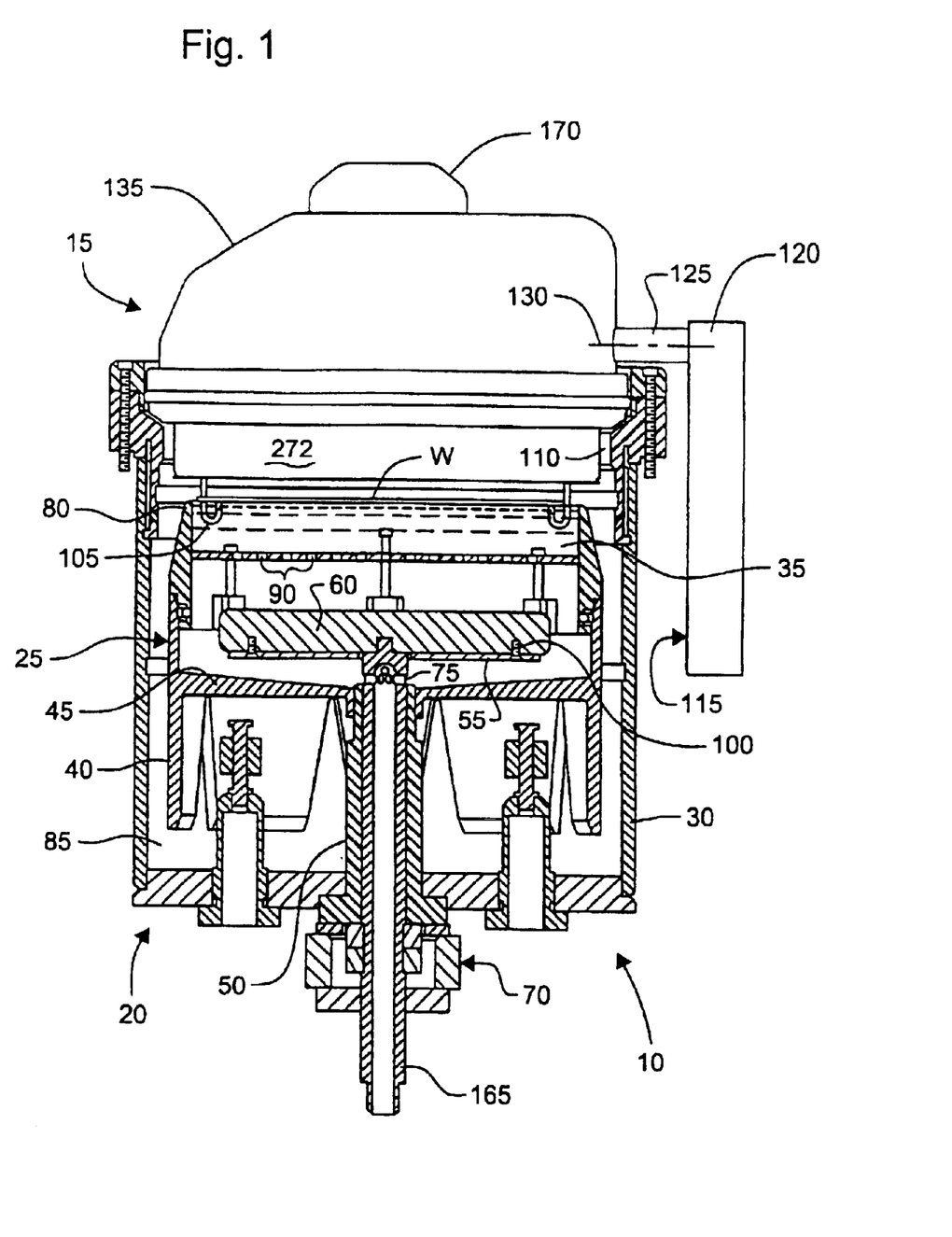
FIG. 1 illustrates one embodiment of a plating apparatus that may be used to apply an electrochemically deposited copper metallization layer to the surface of a semiconductor wafer in accordance with the disclosed methods.

FIG. 1 shows various components of a processing station 10 suitable for electroplating a metal, such as copper, onto a semiconductor wafer in accordance with the disclosed method. The two principal parts of processing station 10 are a processing head, shown generally at 15, and an electroplating bowl assembly 20. It will be recognized however, that a wide variety of processing station configurations may be used to implement the disclosed method and that the specific construction of the station 10 is merely exemplary. To this end, such a processing station may merely comprise an anode, one or more wafer contacts to render the wafer a cathode, a plating chamber having a plating bath that contacts both the wafer and the anode, and a source of plating power. Various configurations of these elements may be employed.

As shown in FIG. 1, the electroplating bowl assembly 20 includes a cup assembly 25 which is disposed within a reservoir container 30. Cup assembly 25 includes a fluid cup portion 35 holding the chemistry for the electroplating process. The cup assembly of the illustrated embodiment also has a depending skirt 40 which extends below the cup bottom 45 and may have flutes open therethrough for fluid communication and release of any gas that might collect as the chamber of the reservoir assembly below fills with liquid. The cup is preferably made from polypropylene or other suitable material.

A lower opening in the bottom wall of the cup assembly 25 is connected to a polypropylene riser tube 50 which, for example, is adjustable in height relative thereto by a threaded connection. A first end of the riser tube 50 is secured to the rear portion of an anode shield 55 which supports anode 60. A fluid inlet line 165 is disposed within the riser tube 50. Both the riser tube 50 and the fluid inlet line are secured with the processing bowl assembly 20 by a fitting 70. The fitting 70 can accommodate height adjustment of both the riser tube and line 65. As such, the connection between the fitting 70 and the riser tube 50 facilitates vertical adjustment of the anode position. The inlet line 65 is preferably made from a conductive material, such as titanium, and is used to conduct electrical current to the anode 60, as well as supply fluid to the cup.

Process fluid is provided to the cup through fluid inlet line 65 and proceeds therefrom through fluid inlet openings 75. Plating fluid then fills the chamber 35 through openings 75 as supplied by a plating fluid pump (not shown) or other suitable supply.

The upper edge of the cup sidewall 80 forms a weir which limits the level of electroplating solution within the cup. This level is chosen so that only the bottom surface of wafer W is contacted by the electroplating solution. Excess solution pours over this top edge surface into an overflow chamber 85.

The outflow liquid from chamber 85 is preferably returned to a suitable reservoir. The liquid can then be treated with additional plating chemicals or other constituents of the plating or other process liquid and used again.

In preferred use of the apparatus for electroplating, the anode 60 is a consumable anode used in connection with the plating of copper or other metals onto semiconductor materials. The specific anode may alternatively be an inert anode, the anode used in station 10 varying depending upon the specifics of the plating liquid and process being used.

The embodiment of the station shown in FIG. 1 also employs a diffuser plate 90 which is disposed above the anode 60 for providing a more even distribution of the flow of the fluid plating bath across the surface of wafer W. Fluid passages are provided over all or a portion of the diffuser plate 90 to allow fluid communication therethrough. The height of the diffuser plate within the cup assembly may be adjustable using height adjustment mechanisms 95.

The anode shield 55 is secured to the underside of the consumable anode 60 using anode shield fasteners 100 to prevent direct impingement by the plating solution as the solution passes into the processing chamber 35. The anode shield 55 and anode shield fasteners 100 are preferably made from a dielectric material, such as polyvinylidene fluoride or polypropylene. The anode shield serves to electrically isolate and physically protect the backside of the anode.

The processing head 15 holds a wafer W within the processing chamber 35. In the disclosed embodiment of station 10, the head 15 is constructed to rotate the wafer W within chamber 35. To this end, the processing head 15 includes a rotor assembly 150 having a plurality of waferengaging contact fingers 105 that hold the wafer against features of the rotor. Fingers 105 are preferably adapted to conduct current between the wafer and a plating electrical power supply and may be constructed in accordance with various configurations.

The processing head 15 is supported by an head operator 115. Head operator 115 includes an upper portion 120 which is adjustable in elevation to allow height adjustment of the processing head. Head operator 115 also has a head connection shaft 125 which is operable to pivot about a horizontal pivot axis 130. Pivotal action of the processing head using operator 115 allows the processing head to be placed in an open or face-up position (not shown) for loading and unloading wafer W. FIG. 1 illustrates the processing head pivoted into a face-down position in preparation for processing. It will be recognized that such flipping of the wafer is not necessary to the performance of the disclosed methods.

Figure 2A:
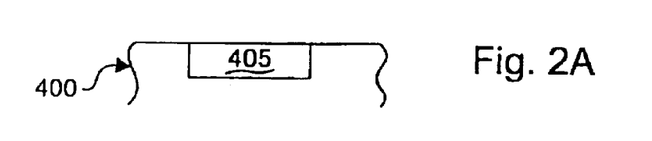
FIGS. 2A–2G illustrate the various steps used in one embodiment of the disclosed method.
Figure 2B:
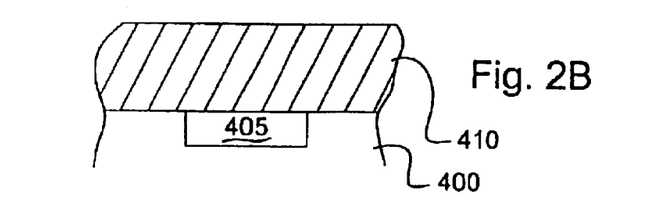
Figure 2C:
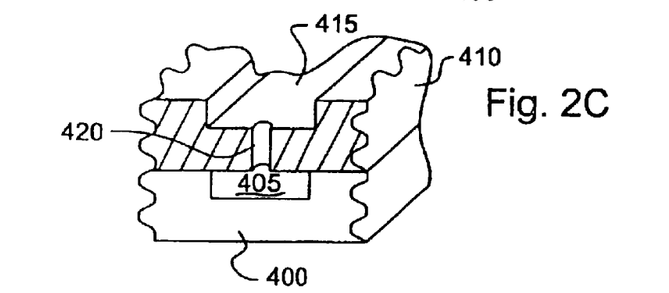

FIGS. 2A–2G illustrate one method of filling a trench and via formed on the surface of a semiconductor wafer wherein the electrochemically deposited copper layer may be applied using the apparatus described in connection with FIG. 1. FIG. 2A illustrates a base 400 having an area 405 which is to be connected by copper metallization. In FIG. 2B a layer 410 of dielectric material, such as silicon dioxide or a low-K dielectric material, is deposited over the base 400 including over area 405. Through a photoresist process and reactive ion etch or the like, selective portions of layer 410 are removed to form, for example, a trench 415 and via 420 into which copper metallization is to be deposited. The end structure is shown in the perspective view of FIG. 2C wherein the via 420 overlies connection area 405 and trench 415 overlies via 420. Connection area 405 may be, for example, a metallization feature above the substrate.

Figure 2D:
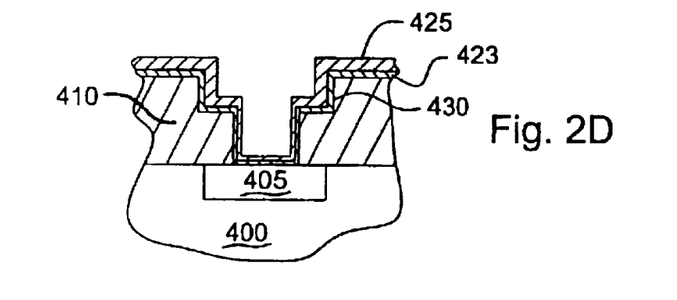

As shown in FIG. 2D, a barrier layer 423 and seed layer 425 may be disposed on the surface of dielectric layer 410. The barrier layer may be, for example, tantalum or titanium nitride. The barrier layer 423 is typically used when the structure 405 is susceptible to contamination from copper or the seed layer metal, and/or when the seed layer metal or copper may readily migrate through the dielectric layer 410 and contaminate other portions of the microelectronic circuit. As such, barrier layer 423 should be sufficiently thick along the contour of the trenches and vias to act as a diffusion barrier. Layer 423 may also function as an adhesion layer to facilitate binding between the seed layer 425 and the dielectric 410. If, however, the structure 405 is not susceptible to such contamination, there is sufficient adhesion, and the dielectric layer 410 itself acts as a barrier layer, then a separate barrier layer 423 may not be necessary. The seed layer 425 may, for example, be a copper layer or other conductive metal layer and is preferably at least 200 Angstroms thick at its thinnest point. Sidewalls 430 of the trench 415 and via 420 as well as the bottom of via 420 should be covered by the seed layer 425 and barrier layer 423 to facilitate a subsequent electrochemical copper deposition step. The seed layer 425 may be deposited through, for example, a CVD or PVD process.

The semiconductor wafer with the seed layer 425 is subject to a subsequent electrochemical copper deposition process. The electrochemical copper deposition process is executed so as to form numerous nucleation sites for the copper deposition to thereby form grain sizes that are substantially smaller than the characteristic dimensions of the via 420 and trench 415. An exemplary structure having such characteristics is illustrated in FIG. 4E wherein layer 440 is a layer of copper metallization that has been deposited using an electrochemical deposition process.

Figure 2E:
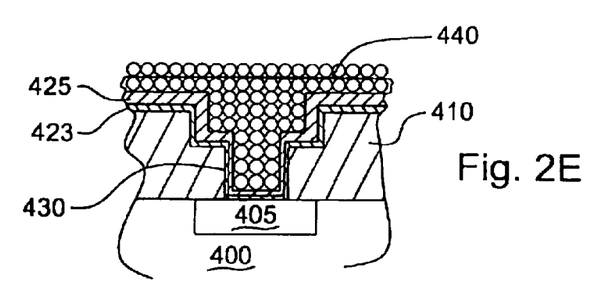
Figure 2F:
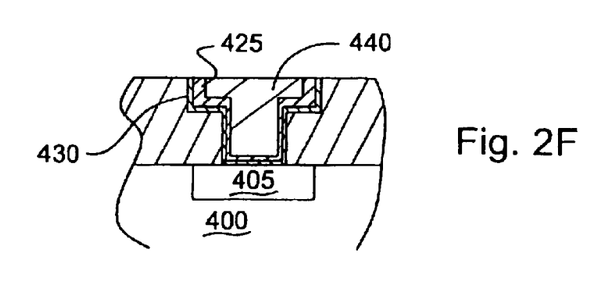
Figure 2G:
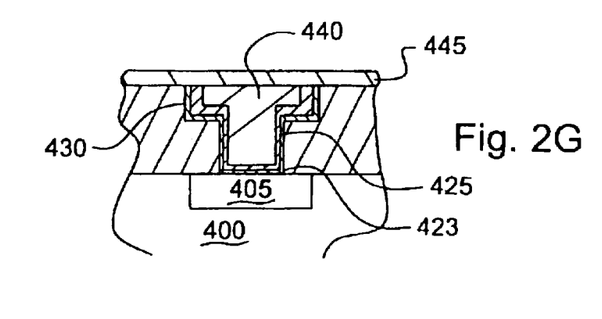

As shown in FIG. 2E, the copper metallization 440 formed in the electrochemical deposition process is deposited over the seed layer 425 and extends a distance above the surface of dielectric layer 410. Since the only features that are to contain the metallization are the via 420 and trench 415, excess copper above the dielectric layer 410 must be removed. Removal of the excess copper above the upper surface of the dielectric layer 410 may be executed using a chemical mechanical polish technique. An exemplary structure in which such removal has taken place is illustrated in FIG. 2F. After such removal, a capping barrier layer 445 may be disposed, for example, over the entire surface of the wafer, or the processes set forth in FIGS. 2A–2F may be repeated without a capping barrier layer 445 whereby the trench 415, now filled with copper metallization, corresponds to the structure 405 that further copper metallization is to contact.

A comparison between FIGS. 4E and 4F reveals that an increase in the grain size of the copper layer 440 has taken place. Traditionally, the change in the grain size has been forced through an annealing process. In such an annealing process, the wafer is subject to an elevated temperature that is substantially above the ambient temperature conditions normally found in a clean room. For example, such annealing usually takes place in a furnace having a temperature generally around or slightly below 400 degrees Celsius, or about half of the melting temperature of the electrodeposited copper. Annealing steps are normally performed at a temperature of at least 25 percent of the melting point temperature of the material as measured on an absolute temperature scale. As such, a separate annealing step is performed on the wafer using a separate piece of capital equipment. Such an annealing step is usually performed for each layer of metallization that is deposited on the wafer. These additional steps increase the cost of manufacturing devices from the wafer and, further, provide yet another step in which the wafer may be mishandled, contaminated, or otherwise damaged.

Absent such an annealing step, the traditional view is that the substantial number of grains per given volume in such sub-micron structures significantly decreases the electromigration resistance of the metal lines that are produced and gives the material a higher resistivity. This is due to the fact that grain boundary migration occurs with a much lower activation energy than trans-granular migration. As such, conventional wisdom dictates that a separate annealing step is required.

The present inventors have found that such a separate annealing step in which the electrochemically deposited copper is subject to a subsequent high temperature annealing process (e.g., at about 400 degrees Celsius) is not, in fact, necessary. Rather, electrochemically deposited copper metallization having grain sizes substantially smaller than the sub-micron structures that they fill may be subject to an annealing process in which the annealing of the copper metallization takes place at, for example, room temperature or at temperatures substantially below 400 degrees Celsius where the annealing process is more easily controlled and throughput is increased.

In accordance with one embodiment of the disclosed method, the electrochemical deposition of the copper layer 440 takes place in the apparatus set forth in FIG. 1. The processing chamber 110 is configured so that the top of the diffuser 90 is approximately between 0.5 cm–5 cm (preferably 2.0 cm) from the top of the cup 25. The distance between the top of the diffuser 90 and the top of the anode 60 is between 0.5 cm–10 cm (preferably 1.6 cm) but always greater than the diffuser to cup distance.

The electrochemical plating solution may be Enthone-OMI Cu Bath M Make-up Solution having 67 g/l of CuSO4, 170 g/l of H2SO4, and 70 ppm of HCl. The additive solutions utilized may be Enthone-OMI Cu Bath M-D (6.4 ml/l—make-up) and Enthone-OMI Cu Bath M LO 70/30 Special (1.6 ml/l—make-up). The flow rate through the cup 25 of this solution may be approximately 1.0–10 GPM (preferably 5.5 GPM) and the plating temperature may be between about 10–40 degrees Celsius (preferably 25 degrees Celsius). The plating bath could alternatively contain any of a number of additives from manufacturers such as Shipley (Electroposit 1100), Lea Ronal (Copper Gleam PPR), or polyethylene glycol (PEG).

The electrochemical process of the disclosed embodiment may be used to electroplate a copper metallization layer onto the wafer at a thickness sufficient to at least fill the trenches and/or vias. Generally stated, the embodiment disclosed herein may be divided into five sub-processes. A dwell (pre-plate) sub-process takes place when the wafer is first introduced to the electroplating bath. At that time, no plating current is provided. Rather, the surface of the wafer that is to be plated is exposed to the plating bath for a predetermined period of time without plating power, such as for five seconds.

After the dwell cycle, a low current initiation sub-process may ensue. During the low current initiation sub-process, a low plating current is provided between the anode and the wafer. In accordance with the disclosed embodiment, a direct current with a current density of approximately 3.2 mA/cm$^2$ is utilized. The low current process may proceed, for example, for a predetermined period of time such as 30 seconds.

After the low current initiation sub-process is completed, a high current plating sub-process is initiated. It is during this sub-process that a majority of the copper is plated onto the wafer. During this step, a high plating current is provided for the electroplating operations. The plating waveform may be a constant voltage or current, a forward-only pulsed voltage or current, or a forward and reverse voltage or current. In accordance with the disclosed embodiment, and average cathode current density of approximately 20 mA/cm$^2$ is used with a current waveform that is direct current, forward pulsed, or reverse pulsed. Preferably a direct current or forward only pulsed current is utilized with a frequency between 1 and 1000 Hz. More preferably, the frequency is between 5 and 20 Hz, with a duty cycle between 50 percent and 95 percent. More preferably, the duty cycle is between 65 percent and 85 percent. The time duration of the high current plating sub-process is dependent on the nominal thickness of the copper metallization layer that is to be applied to the wafer. For a copper metallization layer having a nominal thickness of 1.5 microns, the high current sub-process proceeds for approximately three minutes and 40 seconds. During both the low current initiation and high current plating sub-processes, the wafer is preferably spun on the rotor at a rate of between about 1–100 rpm (preferably 20 rpm).

Once the desired amount of copper has been plated onto the wafer, the wafer is lifted from contact with the plating solution. This process takes approximately two seconds, after which the wafer is spun on the rotor to remove the plating solution. For example, the wafer may be spun at 200–2000 rpm (preferably 500 rpm) for a time period of five seconds to remove the majority of the electroplating solution from the surface of the wafer. Subsequent rinsing and drying steps may be executed on the wafer in, for example, other processing chambers dedicated to such functions.

The foregoing process generates nucleation sites, grain growth mechanisms, and copper grain sizes that are sufficiently small so as to fill trenches and vias with widths as low or less than 0.3 micron and aspect ratios greater than 4-to-1. Initial grain size may be varied depending upon the plating waveform used and/or the additives used in the plating solution Despite the small copper grain size that results from these processes, the resulting copper metallization layer may be annealed at substantially lower temperatures than traditionally suggested to form substantially larger copper grains thereby providing the copper with enhanced electrical characteristics when compared to copper deposition processes that do not promote self-annealing.

Figure 3:
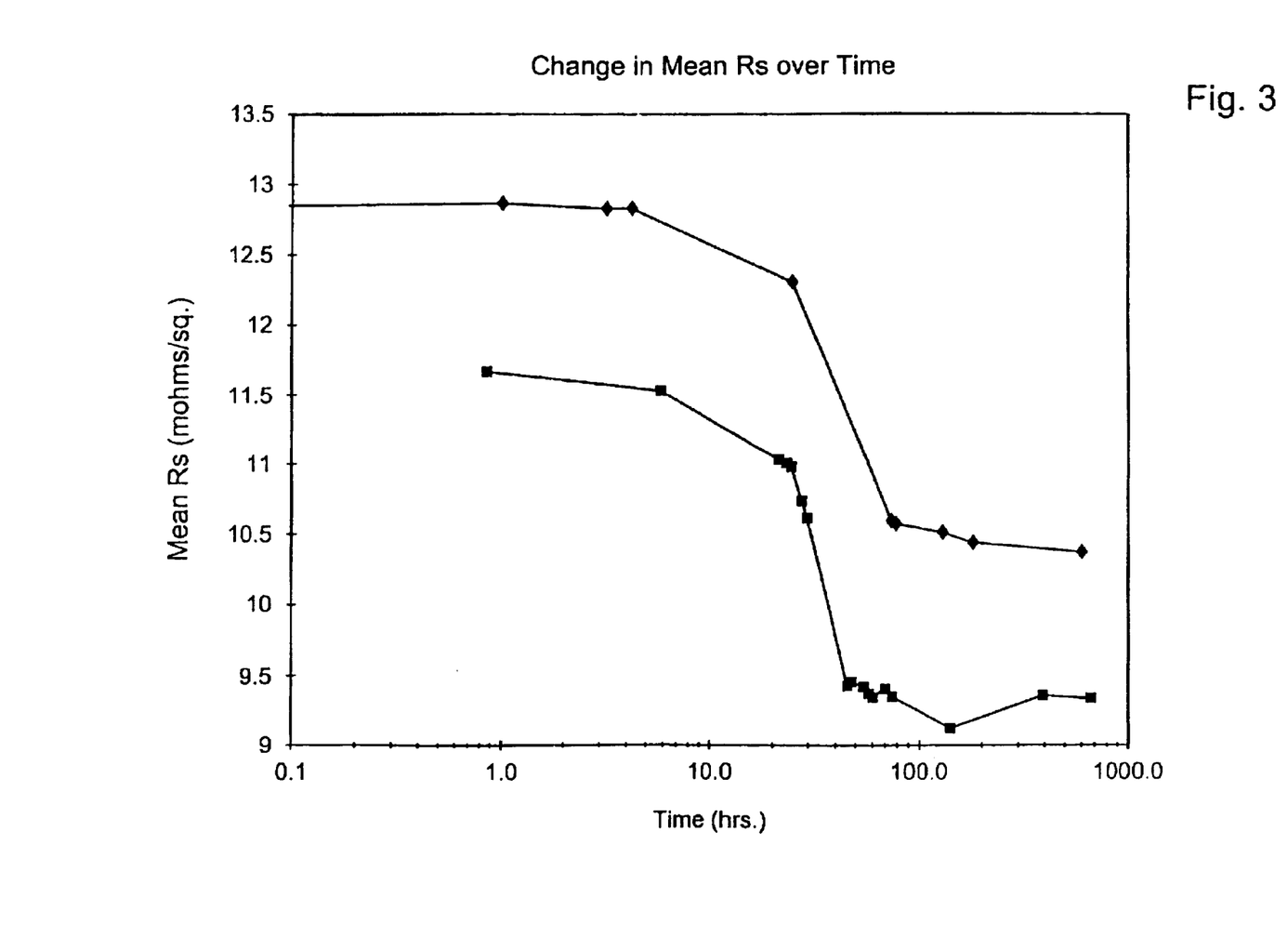
FIG. 3 is a graph showing the sheet resistance of an electrochemically deposited layer that has been deposited in accordance with the disclosed method as a function of time.
Figure 4:
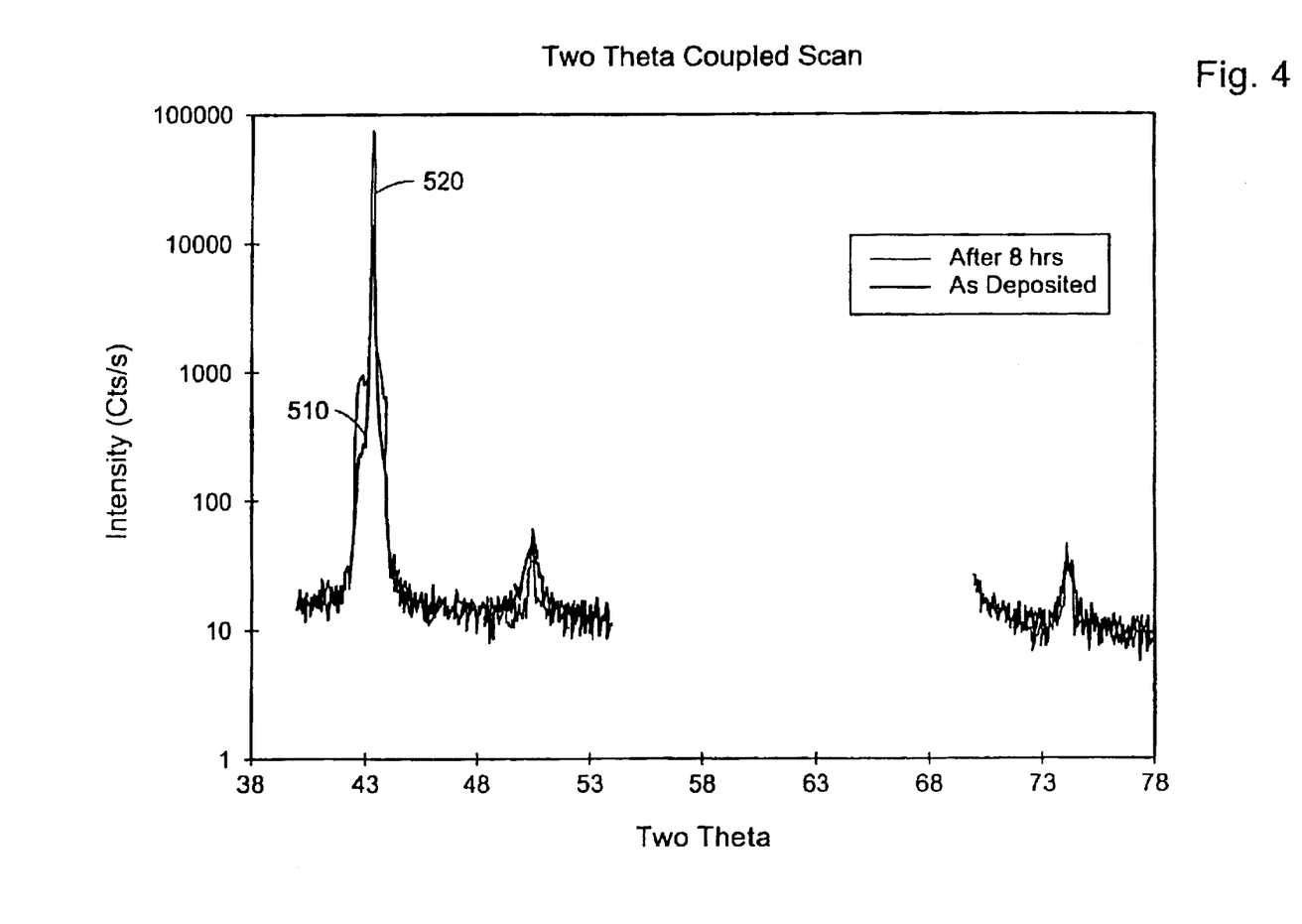
FIGS. 4 and 5 are graphs of various x-ray scanning parameters associated with an electrochemically deposited layer that has been deposited in accordance with the disclosed method.
Figure 5:
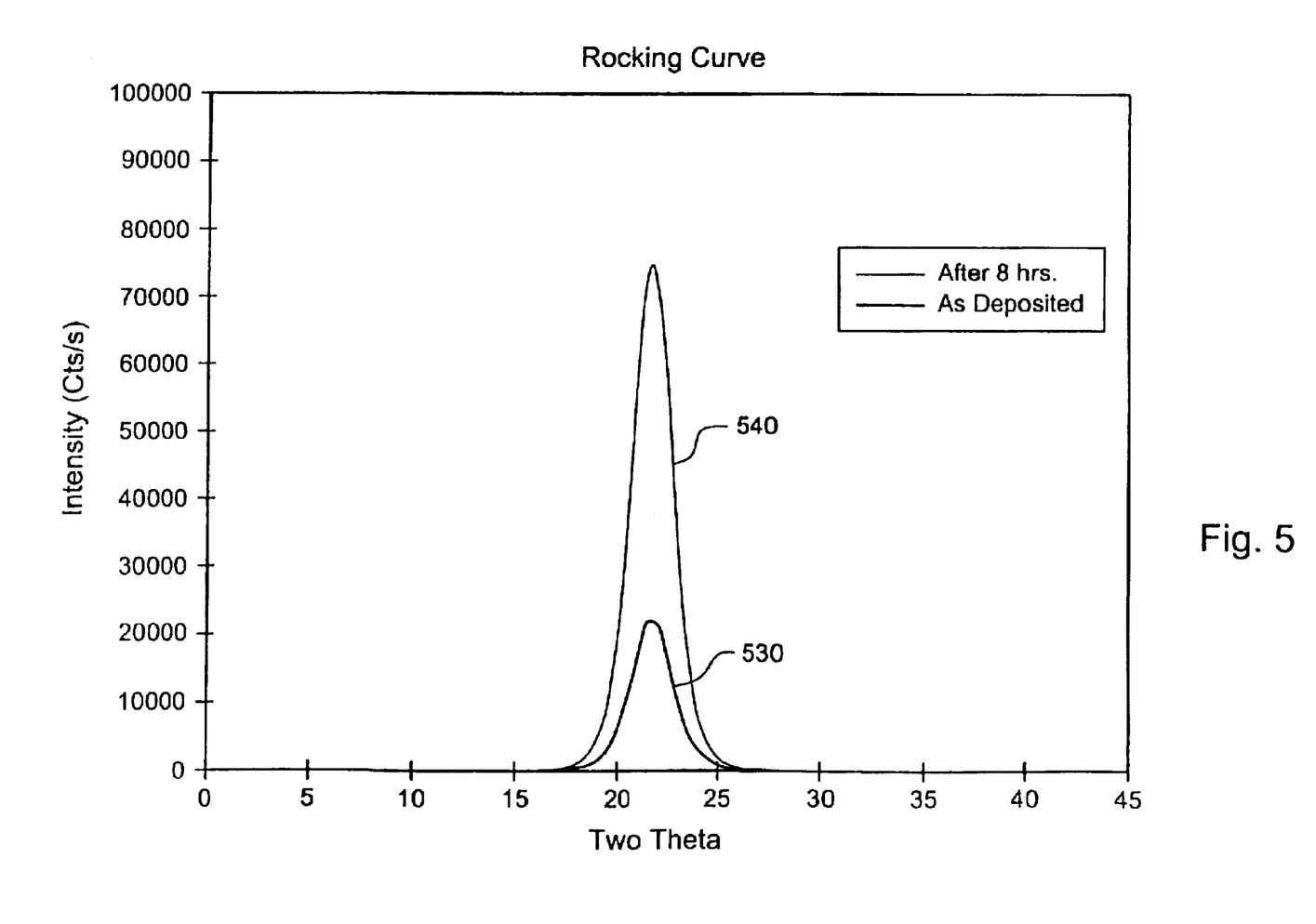

FIGS. 3–5 are derived from experimental data obtained by the present inventors on two different wafers showing that copper metallization deposited in a process in which the initial grain size of the copper crystals is sufficiently small so as to fill sub-micron dimension trenches and vias undergoes a self-annealing process at room temperature. FIG. 3 is a graph of the sheet resistance, Rs, over time of a 1.5 micron copper film deposited in the manner stated above. As illustrated, the sheet resistance begins to decrease approximately eight hours after the copper metallization has been electrochemically deposited on the wafer. After about 20 hours, a substantial decrease in the sheet resistance takes place until, ultimately, the sheet resistance is stabilized at a time between 40 and 80 hours after the deposition. Such measurements were made using a 4-point probe such as a Prometrix RS30.

FIGS. 4 and 5 relate to x-ray diffraction scanning of the electrochemically deposited copper layer. With respect to FIG. 4, the area under each curve is proportional to the volume of the copper film with crystals having their [111] crystal plane directions perpendicular to the plane of the exposed surface of the copper layer. As illustrated, line 510 represents the measurements taken immediately after the copper metallization layer was deposited onto the wafer. Line 520 represents the measurements taken hours after the metallization layer was deposited. A comparison between the curves represented by lines 510 and 520 indicates that the number of reoriented crystals has increased over time.

In the Rocking Curves of FIG. 5, line 530 represents the Rocking Curve of the copper metallization layer immediately after it has been deposited on the wafer, while line 540 represents the Rocking Curve of the copper metallization layer hours after it has been deposited The width of the curve designated by line 530 at half its height, when compared to that of the curve designated by line 540, indicates that the copper crystals are becoming more aligned and that the grain sizes of the copper crystals have increased.

Pursuant to the foregoing findings, one embodiment of the present method requires that the copper metallization be allowed to self-anneal for a predetermined period of time prior to chemical mechanical planarization thereof. At room temperatures, this predetermined period of time may range, for example, between 20 and 80 hours. In accordance with a further embodiment of the method, chemical mechanical planarization may take place before the self-annealing is completed (e.g., before the end of the predetermined period) and, further, may enhance the self-annealing process by imparting activation energy to the metallization layer during the process.

In accordance with a still further embodiment of the method, the copper metallization layer may be annealed before or after chemical mechanical polishing at an elevated temperature which is substantially below the temperature used in the annealing processes that have been traditionally employed. To this end, the wafer having the metallization layer may be placed in an oven having a temperature that is substantially below the 400 degrees Celsius traditionally thought to be necessary to promote the annealing process of copper having such small grain sizes. At a low temperature of about 60 degrees Celsius, the annealing process may be completed in about 15 minutes. At temperatures above 100 degrees Celsius, the annealing times become so short (<1 minute) so as to make annealing at higher temperatures unwarranted and wasteful.

Each of the disclosed embodiments of the method is particularly suitable for providing a copper metallization layer in combination with a low-K dielectric material. Many low-K dielectric materials become unstable if subject to temperatures greater than about 250–300 degrees Celsius. As such, annealing at the traditional temperatures close to about 400 degrees Celsius may destroy these dielectrics. Since the method of the present invention suggests the annealing of the copper metallization layer at temperatures substantially below 400 degrees Celsius (even ambient room temperatures typically found in clean room environments), the method is particularly suitable for use in manufacturing semiconductor devices using both copper metallization and low-K dielectric materials. With respect to the first and second embodiments of the method noted above, the wafer is not subject to any elevated temperature process to anneal the copper layer. With respect to the third embodiment discussed above, the copper metallization may be annealed at an elevated temperature that is high enough to substantially accelerate the self-annealing process while being low enough so as not to corrupt the low-K dielectric material. Low-K dielectric materials suitable for use with such copper metallization layers include, but are not limited to, fluorinated silicon dioxide, polyimides, fluorinated polyimides, siloxanes, parylenes, Teflon AF, nanofoams, aerogels, xerogels. Such low-K dielectrics include commercially available organic polymer dielectrics such as: Avatrel (B.F. Goodrich); BCB and PFCB (Dow Chemical); Flare 1.0 and Flare 1.5 (Allied Signal); PAE2 (Schumacher); and PQ100 and PQ600 (Hitachi). In such instances, the annealing process may also be combined with the baking process required for the low-K dielectric.

The process illustrated in FIGS. 2A–2G indicate that the via 420 and trench 415 are formed together. However, it will be recognized that the structures may be generally formed and filled separately in accordance with the single-damascene process described above. In such instances, the via 420 is first plated in accordance with the steps set forth in FIGS. 2A–2F while the trench 415 is subsequently plated in accordance with the steps set forth in FIGS. 2A–2F after plating of the via 420 has been completed. In effect, the via 420 corresponds to the structure 405 during plating of the trench 415. The methods disclosed herein are suitable for both the single-damascene and dual-damascene processes described herein.

It is also possible to plate micro recessed structures other than those set forth above and employ the foregoing low temperature annealing processes. For example, recessed structures forming a pattern in a photoresist layer may be plated pursuant to other processes used to form copper micro-metallization layers and structures. In such processes, the seed/barrier layer is preferably only provided at the bottoms of the micro-structures and does not cover the photoresist sidewalls. After the plating of the recessed micro-structures, the copper is subject to annealing at room temperature or at an elevated temperature below about 100, substantially below the 400 degrees typically employed.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A method of depositing a material on a microelectronic workpiece, comprising:

placing a microelectronic workpiece having sub-micron recesses in an electroprocessing solution having copper ions;

providing a first current density to the microelectronic workpiece during a first stage of a plating cycle to plate a first amount of copper into at least a portion of the sub-micron recesses in the workpiece, the copper having a sufficiently small grain size to deposit a plurality of grains of copper within a sub-micron recess;

providing a second current density to the microelectronic workpiece during a second stage of the plating cycle after the first stage to plate a second amount of copper onto the workpiece, wherein the second current density is greater than the first current density to create a substantially higher plating rate than the first stage; and annealing the copper plated onto the workpiece during at least one of the first and second stages by heating the workpiece in an elevated temperature environment to increase the grain size of the grains of copper.

2. The method of claim 1 further comprising a dwell stage before the first stage during which no current is provided to the workpiece.

3. The method of claim 1 wherein the first current density is approximately 3.2 mA/cm$^2$.

4. The method of claim 1 wherein the second current density is approximately 20 mA/cm$^2$.

5. The method of claim 1 wherein the current density has a waveform that has a constant voltage during the second stage.

6. The method of claim 1 wherein the current density has a waveform that has a constant current during the second stage.

7. The method of claim 1 wherein the current density has a waveform that has a forward-only pulsed voltage during the second stage.

8. The method of claim 1 wherein the current density has a waveform that has a forward-only pulsed current during the second stage.

9. The method of claim 1 wherein the current density has a waveform that has a forward and reversed voltage during the second stage.

10. The method of claim 1 wherein the current density has a waveform that has a forward and reversed current during the second stage.

11. A method of forming a layer of material on a microelectronic workpiece, comprising:

providing a workpiece having sub-micron recesses and a seed layer for plating copper;

immersing the seed layer of the microelectronic workpiece in a copper electroprocessing solution;

creating a first bias between an electrode in the electroprocessing solution and the seed layer during a first stage of a plating cycle to plate copper into at least a portion of the sub-micron recesses, the copper having a sufficiently small grain size to deposit a plurality of grains of copper within a sub-micron recess;

increasing the bias between the electrode and the seed layer to a second bias during a second stage of the plating cycle to plate additional copper onto the workpiece at a substantially higher plating rate than the first stage; and heating the workpiece in an environment at an elevated temperature to increase the grain size of the plated copper.

12. The method of claim 11 further comprising a dwell stage before the first stage during which no current is provided to the workpiece.

13. The method of claim 11 wherein creating the first bias comprises providing a first current density to the microelectronic workpiece during the first stage.

14. The method of claim 11 wherein:
creating the first bias comprises providing a first current density to the microelectronic workpiece during the first stage; and
creating the second bias comprises providing a second current density to the microelectronic workpiece during the second stage that is greater than the first current density.

15. A method of forming a layer of material on a microelectronic workpiece, comprising:
establishing a first bias between an electrode in an electroprocessing solution containing copper and a microelectronic workpiece having sub-micron trenches during a first stage of a plating cycle to plate copper into at least a portion of the sub-micron trenches, the copper having a sufficiently small grain size to deposit a plurality of grains of copper within a sub-micron recess;
creating a second bias between the electrode and the microelectronic workpiece during a second stage of the plating cycle, wherein the second bias is greater than the first bias to create a substantially higher plating rate than the first stage; and
increasing a grain size of material deposited onto the workpiece after the second stage at an elevated temperature.

16. The method of claim 15 further comprising a dwell stage before the first stage during which no bias is established between the electrode and a seed layer on the workpiece.

17. The method of claim 15 wherein establishing the first bias comprising providing a first current density to the microelectronic workpiece during the first stage.

18. The method of claim 15 wherein:
establishing the first bias comprises providing a first current density to the microelectronic workpiece during the first stage; and
creating the second bias comprises providing a second current density to the microelectronic workpiece during the second stage.

19. A method of forming a layer of material on a microelectronic workpiece, comprising:
establishing a first field potential between an electrode in an electroprocessing solution containing copper and a microelectronic workpiece having sub-micron recesses during a first stage of a plating cycle to plate copper into at least a portion of the sub-micron recesses, the copper having a sufficiently small grain size to deposit a plurality of grains of copper within a sub-micron recess;
increasing the field potential between the electrode and the microelectronic workpiece to a second field potential during a second stage of the plating cycle by increasing the current to further plate copper onto the microelectronic workpiece at a substantially higher plating rate than the first stage; and
placing the workpiece in an environment at an elevated temperature after the second stage to increase the grain size of the grains of copper.

20. The method of claim 1 wherein heating the microelectronic workpiece in an elevated temperature environment comprises subjecting the microelectronic workpiece to a heat of approximately 60° C. to 300° C.

21. The method of claim 1 wherein heating the microelectronic workpiece in an elevated temperature environment comprises subjecting the microelectronic workpiece to a heat of less than 400° C.

22. The method of claim 1, further comprising spinning the microelectronic workpiece during the second stage.

23. The method of claim 1, further comprising lifting the microelectronic workpiece from the electroprocessing solution after the second stage and removing electroprocessing solution from the microelectronic workpiece by spinning the workpiece.

24. The method of claim 1, further comprising rinsing the workpiece in a different chamber after the second stage and before annealing the material deposited onto the workpiece.

25. The method of claim 1, further comprising:
lifting the microelectronic workpiece from the electroprocessing solution after the second stage;
removing electroprocessing solution from the microelectronic workpiece by spinning the workpiece; and
annealing the material plated onto the workpiece in an elevated temperature environment comprises subjecting the workpiece to a heat of approximately 60° C. to 300° C.

26. The method of claim 11 wherein heating the microelectronic workpiece in an environment at an elevated temperature comprises subjecting the microelectronic workpiece to a heat of approximately 60° C. to 300° C.

27. The method of claim 11 wherein heating the microelectronic workpiece in an environment at an elevated temperature comprises subjecting the microelectronic workpiece to a heat of less than 400° C.

28. The method of claim 11, further comprising spinning the microelectronic workpiece during the second stage.

29. The method of claim 11, further comprising lifting the microelectronic workpiece from the electroprocessing solution after the second stage and removing electroprocessing solution from the microelectronic workpiece by spinning the workpiece.

30. The method of claim 11, further comprising rinsing the workpiece in a different chamber after the second stage and before heating the workpiece in an environment at an elevated temperature.

31. The method of claim 11, further comprising:
lifting the microelectronic workpiece from the electroprocessing solution after the second stage;
removing electroprocessing solution from the microelectronic workpiece by spinning the workpiece; and
heating the workpiece in an elevated temperature environment at a temperature of approximately 60° C. to 300° C.

32. The method of claim 15 wherein increasing the grain size of the material deposited onto the workpiece comprises heating the microelectronic workpiece in an environment at approximately 60° C. to 300° C.

33. The method of claim 15 wherein increasing the grain size of the material deposited onto the workpiece comprises heating the microelectronic workpiece in an environment at less than 400° C.

34. The method of claim 15, further comprising spinning the microelectronic workpiece during the second stage.

35. The method of claim 15, further comprising lifting the microelectronic workpiece from the electroprocessing solution after the second stage and removing electroprocessing solution from the microelectronic workpiece by spinning the workpiece.

36. The method of claim 15, further comprising rinsing the workpiece in a different chamber after the second stage and before increasing the grain size of the material deposited onto the workpiece.

37. The method of claim 15, further comprising:

lifting the microelectronic workpiece from the electroprocessing solution after the second stage;

removing electroprocessing solution from the microelectronic workpiece by spinning the workpiece; and increasing the grain size of the material deposited onto the workpiece by subjecting the workpiece to a heat of approximately 60° C. to 300° C.

38. The method of claim 19 wherein placing the workpiece in an environment at an elevated temperature comprises subjecting the workpiece to a heat of approximately 60° C. to 300° C.

39. The method of claim 19 wherein placing the workpiece in an environment at an elevated temperature comprises subjecting the workpiece to a heat of less than 400° C.

40. The method of claim 19, further comprising spinning the microelectronic workpiece during the second stage.

41. The method of claim 19, further comprising lifting the microelectronic workpiece from the electroprocessing solution after the second stage and removing electroprocessing solution from the microelectronic workpiece by spinning the workpiece.

42. The method of claim 19, further comprising rinsing the workpiece in a different chamber after the second stage and before placing the workpiece in an environment at an elevated temperature.

43. The method of claim 19, further comprising:

lifting the microelectronic workpiece from the electroprocessing solution after the second stage;

removing electroprocessing solution from the microelectronic workpiece by spinning the workpiece; and placing the workpiece in an environment at en elevated temperature comprises subjecting the workpiece to a heat of approximately 60° C. to 300° C.

* * * * *

UNITED STATES PATENT AND TRADEMARK OFFICE
CERTIFICATE OF CORRECTION

PATENT NO. : 6,753,251 B2
DATED : June 22, 2004
INVENTOR(S) : Thomas L. Ritzdorf et al.

It is certified that error appears in the above-identified patent and that said Letters Patent is hereby corrected as shown below:

Column 1,
Line 37, "die" should be -- the --;

Column 3,
Line 22, "fore" should be -- before --;

Signed and Sealed this

Twenty-first Day of December, 2004

JON W. DUDAS
*Director of the United States Patent and Trademark Office*

UNITED STATES PATENT AND TRADEMARK OFFICE
CERTIFICATE OF CORRECTION

PATENT NO. : 6,753,251 B2 Page 1 of 1
APPLICATION NO. : 10/112166
DATED : June 22, 2004
INVENTOR(S) : Thomas L. Ritzdorf et al.

It is certified that error appears in the above-identified patent and that said Letters Patent is hereby corrected as shown below:

Column 5
Line 6, "an" should be --a--;
Line 65, "4E" should be --2E--;

Column 6
Line 17, "4E, 4F" should be --2E, 2F--;

Column 7
Line 40, "and" should be --an--

Column 11
Line 47, "comprising" should be --comprises--;

Signed and Sealed this

Fifteenth Day of January, 2008

JON W. DUDAS
*Director of the United States Patent and Trademark Office*